(12) United States Patent
Kao et al.

(10) Patent No.: US 7,834,368 B2
(45) Date of Patent: Nov. 16, 2010

(54) LIGHT-EMITTING DIODE HAVING ADDITIONAL STACK STRUCTURE

(75) Inventors: Lin-Chieh Kao, Caotun (TW); Shu-Ying Yang, Gangshan (TW)

(73) Assignee: Huga Optotech, Inc., Taichung (TW)

( * ) Notice: Subject to any disclaimer, the term of this patent is extended or adjusted under 35 U.S.C. 154(b) by 0 days.

(21) Appl. No.: 12/426,407

(22) Filed: Apr. 20, 2009

(65) Prior Publication Data

US 2010/0193813 A1 Aug. 5, 2010

(30) Foreign Application Priority Data

Feb. 5, 2009 (TW) ................... 98103752

(51) Int. Cl.
| | |
|---|---|
| H01L 29/22 | (2006.01) |
| H01L 33/00 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 29/18 | (2006.01) |

(52) U.S. Cl. ............... 257/94; 257/13; 257/79; 257/88; 257/E33.064

(58) Field of Classification Search .......... 257/13, 257/79, 88, E33.064, 94
See application file for complete search history.

(56) References Cited

U.S. PATENT DOCUMENTS

| | | | | |
|---|---|---|---|---|
| 5,974,071 A | * | 10/1999 | Jiang et al. ............... 372/50.21 |
| 6,057,561 A | * | 5/2000 | Kawasaki et al. ............. 257/94 |
| 6,518,598 B1 | * | 2/2003 | Chen ........................... 257/91 |
| 6,531,405 B1 | * | 3/2003 | Wegleiter et al. ........... 438/745 |
| 6,753,552 B1 | * | 6/2004 | Lan et al. ..................... 257/79 |
| 6,993,214 B2 | * | 1/2006 | Nishimura et al. ............ 385/14 |
| 7,079,562 B2 | * | 7/2006 | Sakamoto et al. ...... 372/46.013 |
| 7,329,587 B2 | * | 2/2008 | Bruederl et al. ............. 438/458 |
| 7,473,936 B2 | * | 1/2009 | Tran et al. .................... 257/95 |
| 7,528,540 B2 | * | 5/2009 | Ikeda ......................... 313/498 |
| 2005/0031005 A1 | * | 2/2005 | Cheng et al. ................. 372/68 |
| 2005/0242712 A1 | * | 11/2005 | Sung .......................... 313/503 |
| 2005/0287899 A1 | * | 12/2005 | Redecker ..................... 445/24 |
| 2006/0044561 A1 | * | 3/2006 | Nii ............................. 356/434 |
| 2008/0121906 A1 | * | 5/2008 | Yakushiji ..................... 257/94 |
| 2008/0191191 A1 | * | 8/2008 | Kim ............................ 257/13 |
| 2008/0315229 A1 | * | 12/2008 | Yi et al. ....................... 257/98 |
| 2010/0059733 A1 | * | 3/2010 | Shei et al. .................... 257/13 |
| 2010/0059769 A1 | * | 3/2010 | Jeong .......................... 257/94 |

* cited by examiner

*Primary Examiner*—Ida M Soward
(74) *Attorney, Agent, or Firm*—Chun-Ming Shih (57) ABSTRACT

A light-emitting diode includes a substrate, a primary stack structure, a secondary stack structure, a transparent insulating material and a transparent conducting layer in an embodiment. Each of the primary and the secondary stack structure has a first conducting-type semiconductor layer, and illuminating layer, and a second conducting-type semiconductor layer sequentially formed on the substrate, wherein plural pillar-like holes are formed at the top surface of the second conducting-type semiconductor layer of the secondary stack structure and protrude into the first conducting-type semiconductor layer of the secondary stack structure. The transparent insulating material is filled into the holes. The transparent conducting layer is coated on the primary stack structure, the transparent insulating material, and the tope surface of the second conducting-type semiconductor layer of the secondary stack structure.

22 Claims, 13 Drawing Sheets

LIGHT-EMITTING DIODE HAVING ADDITIONAL STACK STRUCTURE

BACKGROUND OF THE INVENTION

1. Field of the Invention

The present invention generally relates to a light-emitting diode and a manufacturing method thereof, and more particularly, to a light-emitting diode with high illuminating efficiency and the manufacturing method thereof.

2. Description of the Prior Art

Until now, the light-emitting diode (LED) has already been widely-applied, such as a keyboard, a backlight module of a mobile phone monitor, an illuminative system of a vehicle, an ornamental lamp, and a remote controlling product, etc. In order to make the LED have higher functional stability and lower energy consumption, the illuminating efficiency of the LED should be required.

Figure 1:
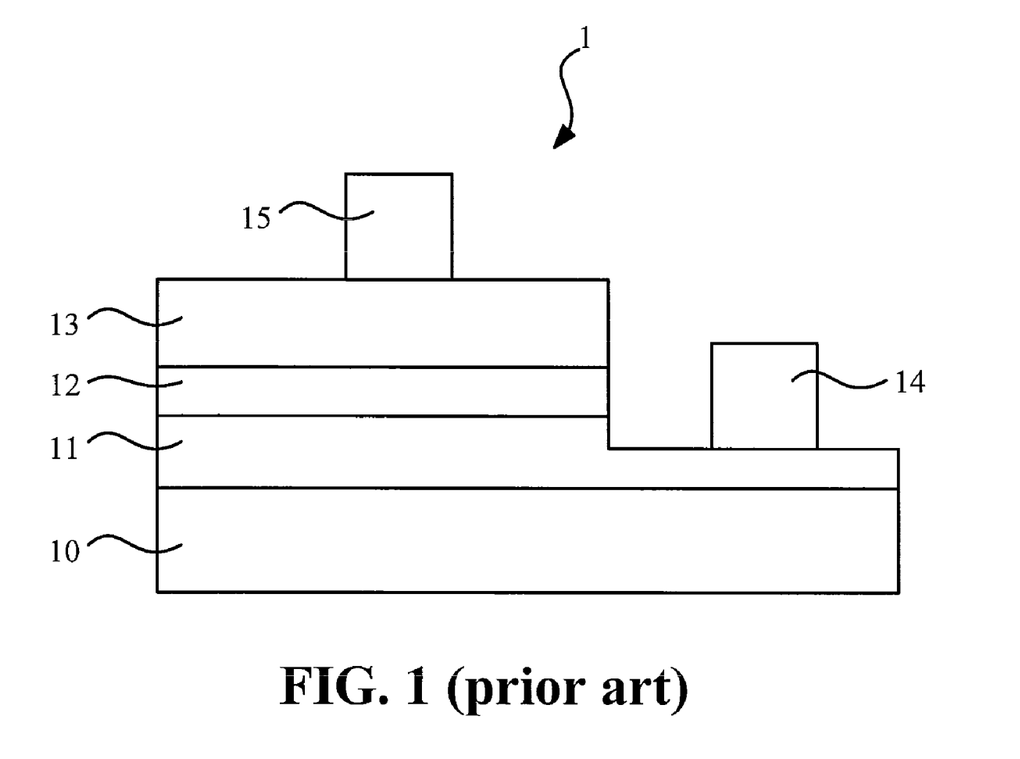
FIG. 1 illustrates a cross-sectional view of a well-known light-emitting diode.

Please refer to FIG. 1. FIG. 1 illustrates a cross-sectional view of a well-known light-emitting diode 1. As shown in FIG. 1, the light-emitting diode 1 includes a substrate 10, a n-type GaN layer 11, an illuminating layer 12, a p-type GaN layer 13, and two electrodes 14, 15. In order to conduct the p-type GaN layer 13 and the n-type GaN layer 11 to operate the light-emitting diode 1, the electrode 15 is formed upon the p-type GaN layer 13, and the electrode 14 is formed upon the p-type GaN layer 11.

Generally, the illuminating efficiency of the light-emitting diode relates to its internal quantum efficiency and light-extraction efficiency. The internal quantum efficiency is decided by the material property and the quality; the light-extraction efficiency means the radiation proportion emitted from the inside of the light-emitting diode to the environment or the inside of the packaged epoxy resin. Although various light-emitting diodes having different structures has been disclosed, how to increase the light-extraction efficiency and illuminating efficiency of the light-emitting diode is still a question to be overcome urgently.

SUMMARY OF THE INVENTION

Accordingly, a scope of the present invention is to provide a light-emitting diode with high illuminating efficiency.

According to a first embodiment of the invention, the light-emitting diode comprises a substrate, a primary stack structure, a secondary stack structure, a transparent insulating material, a transparent conducting layer, a first electrode, and a second electrode.

Wherein, the primary stack structure is formed on the substrate, the secondary stack structure is formed on the substrate, and the secondary stack structure surrounds the primary stack structure. The primary stack structure and the secondary stack structure both have a first conducting-type semiconductor layer, an illuminating layer, and a second conducting-type semiconductor layer sequentially formed on the substrate, wherein a plurality of pillar-like holes is formed in a top surface of the second conducting-type semiconductor layer of the secondary stack structure, and the plurality of pillar-like holes protrudes into the first conducting-type semiconductor layer of the secondary stack structure.

The transparent insulating material is filled into the plurality of pillar-like holes, so that the filled transparent insulating material is about the same height as the plurality of pillar-like holes. The transparent conducting layer is coated upon the second conducting-type semiconductor layer of the primary stack structure, the transparent insulating material, and a surface of the second conducting-type semiconductor layer of the secondary stack structure. The first electrode is formed upon the transparent conducting layer, and the second electrode is formed upon the first conducting-type semiconductor layer.

A scope of the present invention is to provide another light-emitting diode with high illuminating efficiency.

According to a second embodiment of the invention, the light-emitting diode comprises a substrate, a primary stack structure, a secondary stack structure, a transparent insulating material, a first electrode, and a second electrode.

The primary stack structure is formed on the substrate, the secondary stack structure is formed on the substrate and the secondary stack structure surrounds the primary stack structure. The primary stack structure and the secondary stack structure both have a first conducting-type semiconductor layer, an illuminating layer, a second conducting-type semiconductor layer, and a transparent conducting layer sequentially formed on the substrate, wherein a plurality of pillar-like holes is formed in a top surface of the transparent conducting layer of the secondary stack structure and the plurality of pillar-like holes protrudes into the first conducting-type semiconductor layer of the secondary stack structure. In an embodiment, a transparent insulating material is filled into the plurality of pillar-like holes, so that the filled transparent insulating material has the same height with the plurality of pillar-like holes approximately. The first electrode is formed upon the transparent conducting layer, and the second electrode is formed upon the first conducting-type semiconductor layer.

A scope of the present invention is to provide another light-emitting diode with high illuminating efficiency.

According to a third embodiment of the invention, the light-emitting diode comprises a substrate, a primary stack structure, a secondary stack structure, a transparent insulating material layer, a continual transparent conducting layer, a first electrode, and a second electrode.

Wherein, the primary stack structure is formed on the substrate, the secondary stack structure is formed on the substrate and the secondary stack structure surrounds the primary stack structure. The primary stack structure and the secondary stack structure both have a first conducting-type semiconductor layer, an illuminating layer, and a second conducting-type semiconductor layer sequentially formed on the substrate, wherein a plurality of pillar-like holes is formed in a top surface of the second conducting-type semiconductor layer of the secondary stack structure and the plurality of pillar-like holes protrudes into the first conducting-type semi-conductor layer of the secondary stack structure. The transparent insulating material layer is coated on a surface of the plurality of pillar-like holes, and the continual transparent conducting layer is coated on the transparent insulating material layer, the second conducting-type semiconductor layer of the primary stack structure and a surface of the second conducting-type semiconductor layer of the secondary stack structure. The first electrode is formed upon the transparent conducting layer, and the second electrode is formed upon the first conducting-type semiconductor layer.

Compared to prior arts, because the light-emitting diode of the invention includes the plurality of pillar-like holes as mentioned above, the light-extraction efficiency of the light-emitting diode can be increased. Furthermore, filling the transparent insulating material having the high refractive index into the plurality of pillar-like holes can not only lower the total reflection of the ray inner in the light-emitting diode, but also increase the anti-breakdown strength of the component. Additionally, coating the transparent conducting layer upon the top surface of the secondary stack structure can make the driving current of the light-emitting diode to flow to the part without pillar-like holes in the secondary stack structure to make that part of the partial illuminating layer to light, so that that part of illuminating area will be not lost.

The objective of the present invention will no doubt become obvious to those of ordinary skill in the art after reading the following detailed description of the preferred embodiment, which is illustrated in the various figures and drawings.

DETAILED DESCRIPTION OF THE INVENTION

Figure 2A:
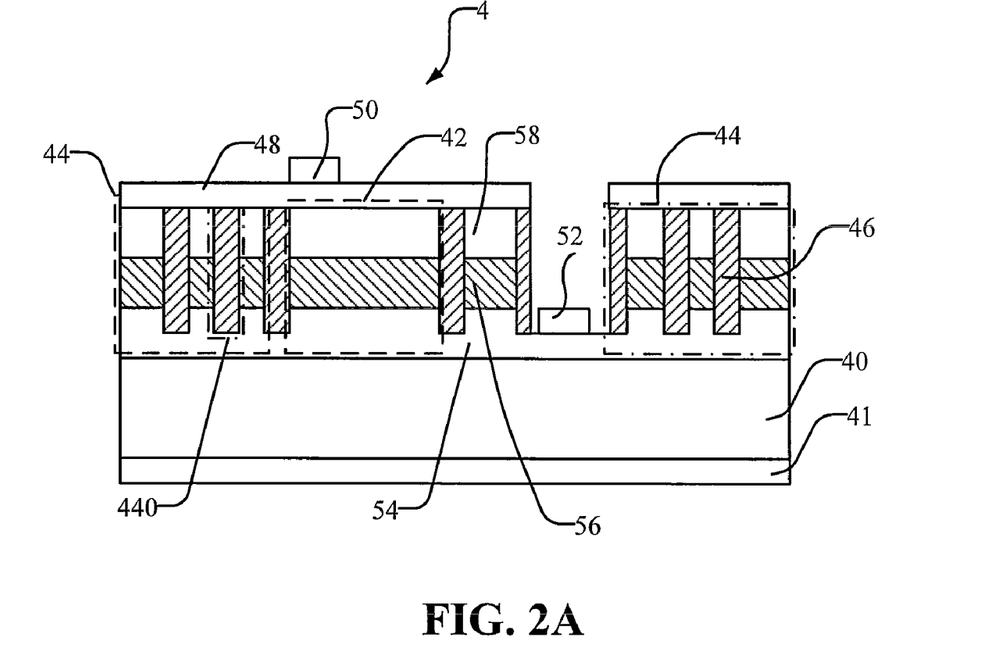
FIG. 2A and FIG. 2B illustrate cross-sectional views of the light-emitting diode in an embodiment of the invention.

Please refer to FIG. 2A. FIG. 2A illustrates a cross-sectional view of the light-emitting diode 4 in an embodiment of the invention.

The light-emitting diode 4 comprises a substrate 40, a primary stack structure 42, a secondary stack structure 44, a transparent insulating material 46, a transparent conducting layer 48, a first electrode 50, and a second electrode 52.

It should be noticed that the primary stack structure 42 is formed on the substrate 40, the secondary stack structure 44 is formed on the substrate 40, and the secondary stack structure 44 surrounds the primary stack structure 42. The primary stack structure 42 and the secondary stack structure 44 both have a first conducting-type semiconductor layer 54, an illuminating layer 56, and a second conducting-type semiconductor layer 58 sequentially formed on the substrate 40, wherein a plurality of pillar-like holes 440 is formed in a top surface of the second conducting-type semiconductor layer 58 of the secondary stack structure 44 and the plurality of pillar-like holes 440 protrudes into the first conducting-type semiconductor layer 54 of the secondary stack structure 44. The transparent insulating material 46 is filled into the plurality of pillar-like holes 440, so that the filled transparent insulating material 46 is about the same height as the plurality of pillar-like holes 440. In practical applications, a cutting way (not shown in FIG. 2A) is defined upon the substrate 40, and the plurality of pillar-like holes are located on the cutting way approximately.

In fact, the first conducting-type semiconductor layer 54, the illuminating layer 56, and the second conducting-type semiconductor layer 58 can be formed by a nitride material. In a preferred embodiment, the refractive index of the transparent insulating material 46 is between the refractive index of the air and the refractive index of the nitride material.

The transparent conducting layer 48 is coated upon the second conducting-type semiconductor layer 58 of the primary stack structure 42, the transparent insulating material 46, and a top surface of the second conducting-type semiconductor layer 58 of the secondary stack structure 44. The first electrode 50 is formed upon the transparent conducting layer 48, and the second electrode 52 is formed upon the exposed part of the first conducting-type semiconductor layer 54. In a preferred embodiment, the light-emitting diode 4 further includes a reflective layer 41 formed on a bottom surface of the substrate 40 to make the light-emitting diode 4 light upward.

Figure 2B:
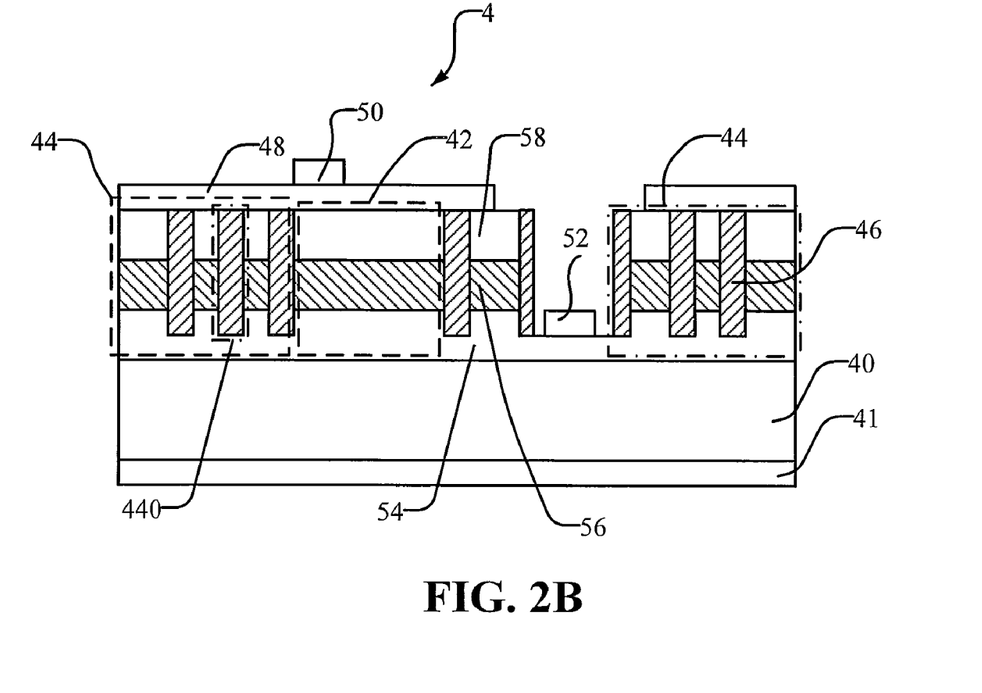

Please refer to FIG. 2B. In another preferred embodiment, a particular area near the second electrode 52 on the surface is reserved without plating the transparent conducting layer 48, so that short-circuit caused by the contact between the transparent conducting layer 48 and the second electrode 52 in wire bonding can be avoided.

Figure 2C:
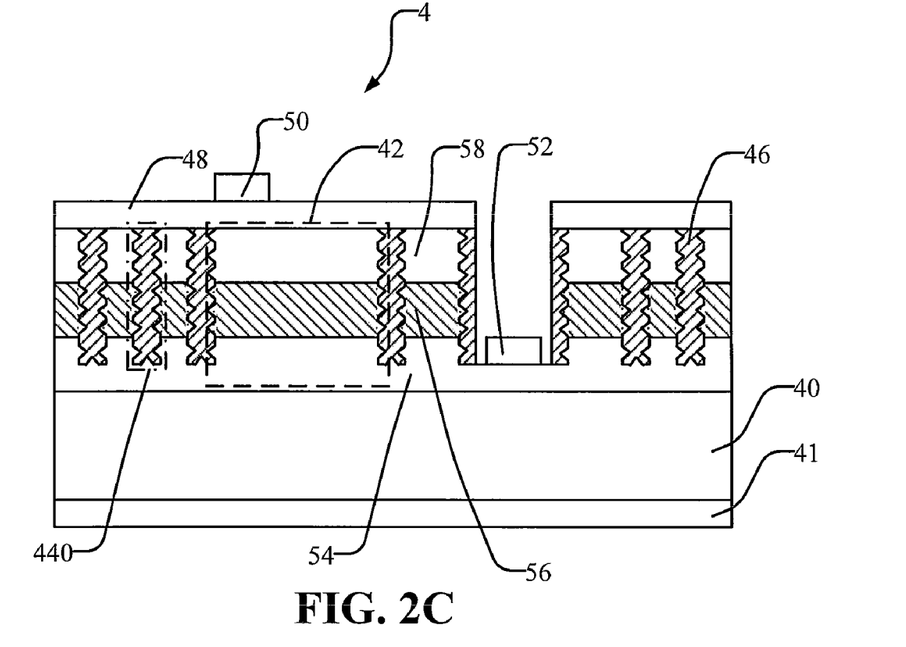
FIG. 2C illustrates a cross-sectional view of the rough surface of the pillar-like holes.
Figure 2D:
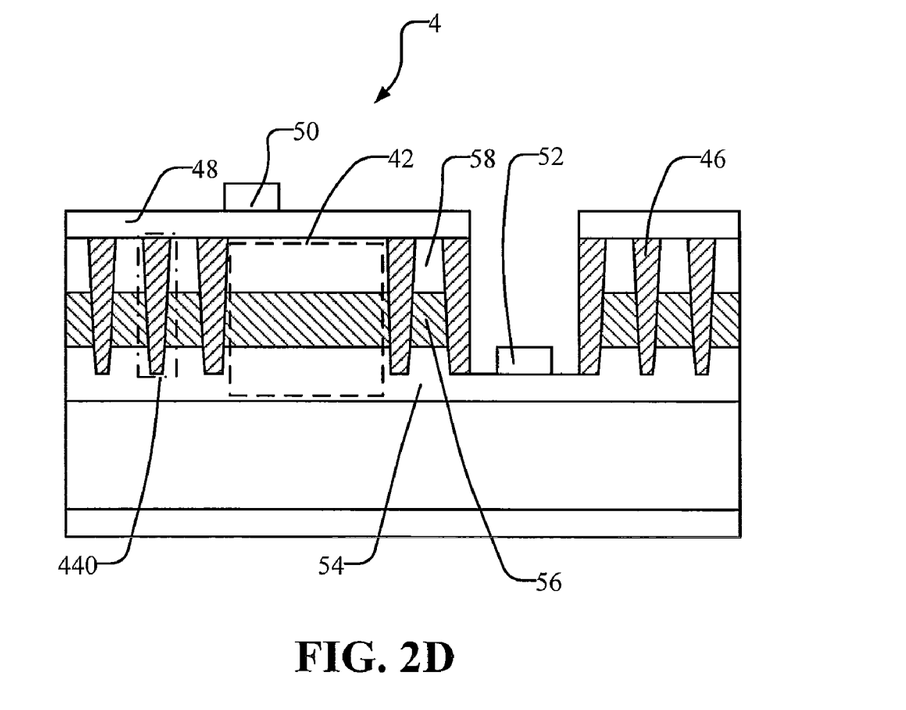
FIG. 2D illustrates a cross-sectional view of the counter-trapezoid cross-section of the pillar-like holes.

It should be noticed that the surface outline of the plurality of pillar-like holes 440 can be designed to further increase the illumining output efficiency of the LED. In a preferred embodiment, the plurality of pillar-like holes 440 has a rough sidewall and a rough bottom, as shown in FIG. 2C. In another preferred embodiment, the plurality of pillar-like holes 440 has a counter-trapezoid cross-section, as shown in FIG. 2D.

Moreover, in another embodiment, the first electrode 50 of the light-emitting diode 4 is formed upon the transparent conducting layer 48, and the second electrode 52 can be formed upon a lower surface of the substrate 40. It should be noticed that the substrate is formed by the conducting material in this embodiment. The advantage of the light-emitting diode relates to this embodiment is that no part of the illuminating layer need to be etched to form an electrode placing region on the top surface of the first conducting-type semiconductor layer having the partial region exposed; as a result, the light-emitting diode in this embodiment has larger illuminating area.

Figure 3A:
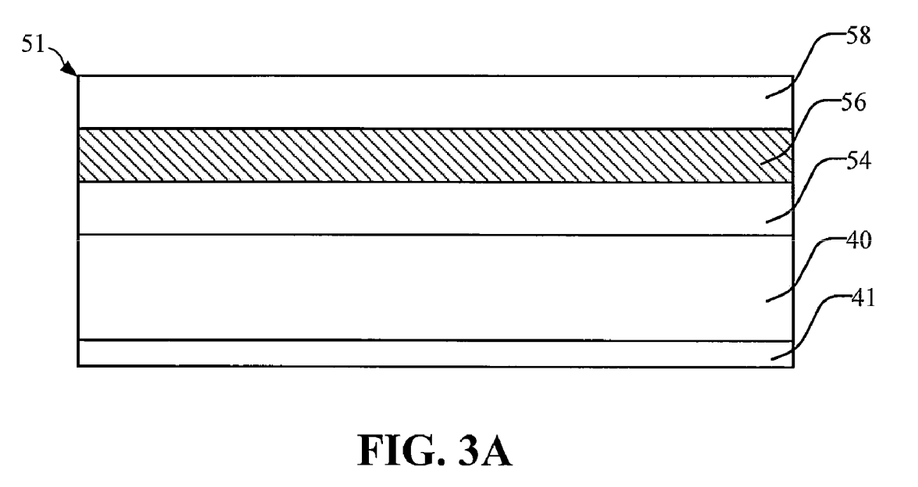
FIG. 3A~FIG. 3F illustrate a series of cross-sectional views of the manufacturing method of the light-emitting diode shown in FIG. 2A.

Please refer to FIG. 3A~FIG. 3F~FIG. 3A to FIG. 3F illustrate a series of cross-sectional views of manufacturing the light-emitting diode 4 in an embodiment of the invention. The manufacturing method will be described as follows:

As shown in FIG. 3A, firstly, the first conducting-type semiconductor layer 54, the illuminating layer 56, and the second conducting-type semiconductor layer 58 are formed on the substrate 40 to make a semiconductor stack structure 51. In a preferred embodiment, the method further forms a reflective layer 41 on a bottom surface of the substrate 40 to make the light-emitting diode 4 light upward.

Figure 3B:
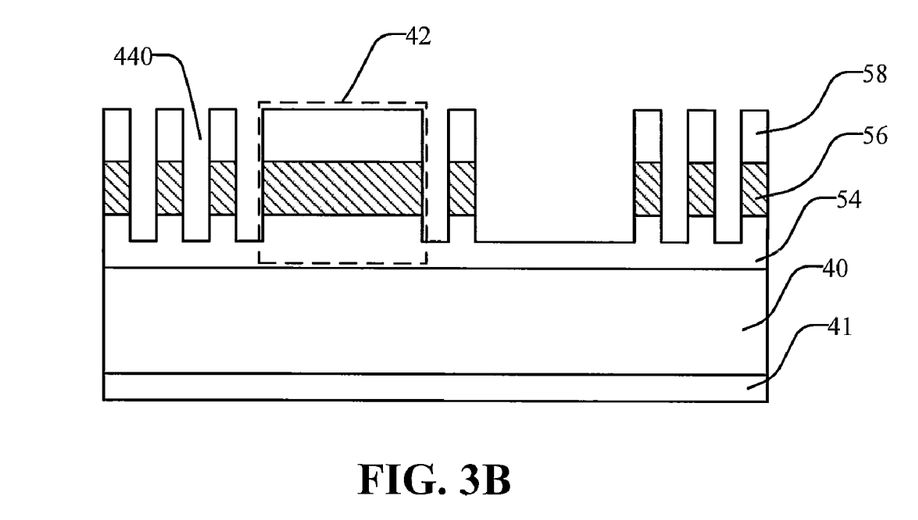
Figure 3C:
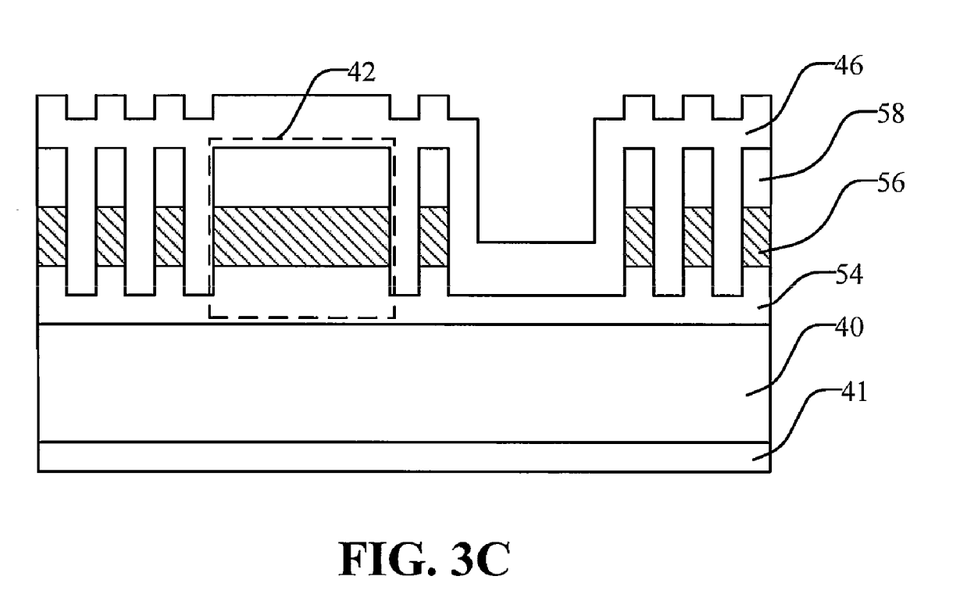
Figure 3D:
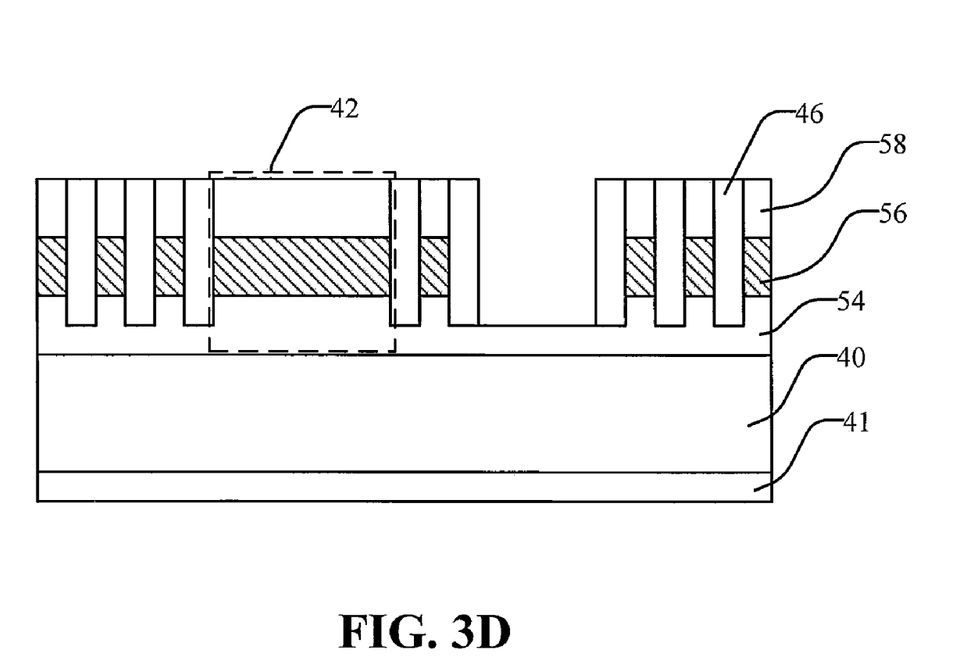
Figure 3E:
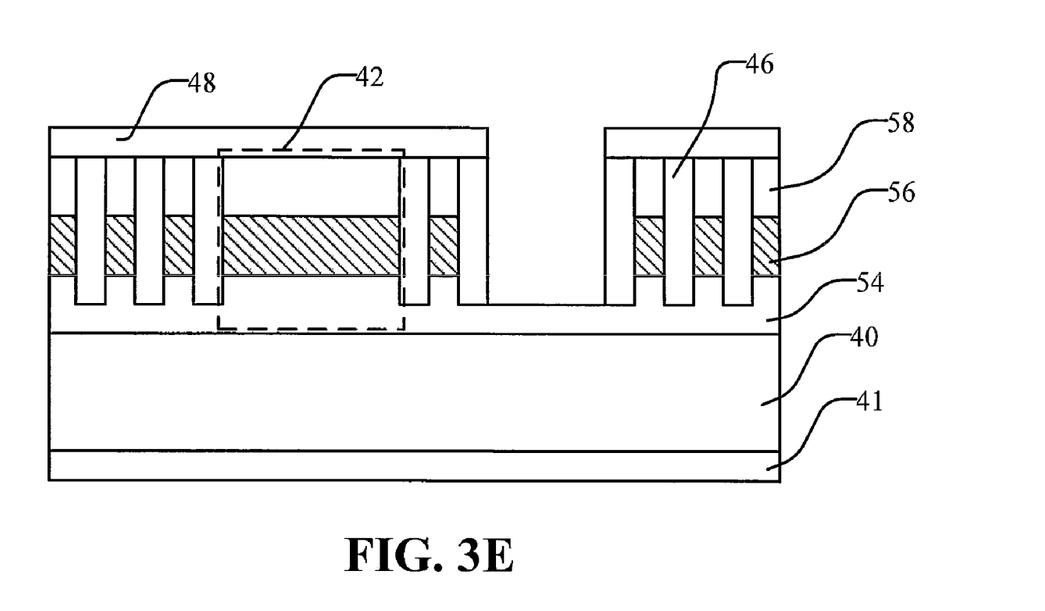
Figure 3F:
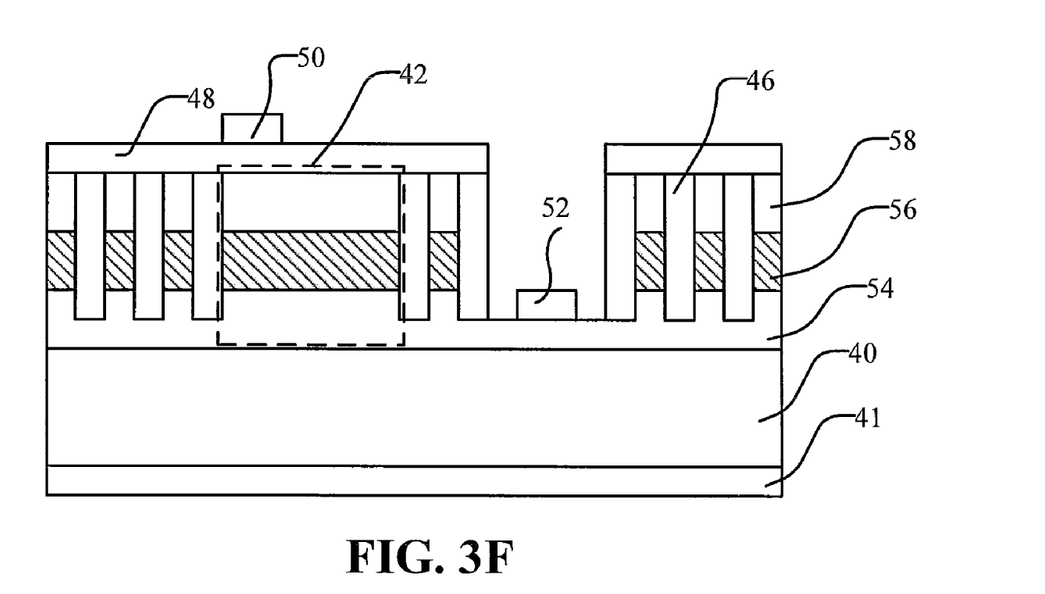
Figure 3G:
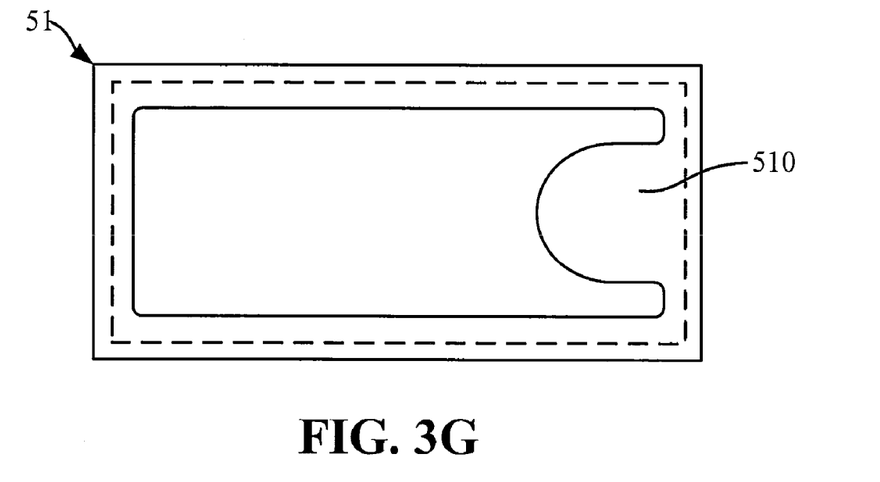
FIG. 3G illustrates a top view of the structure shown in FIG. 3A.
Figure 3H:
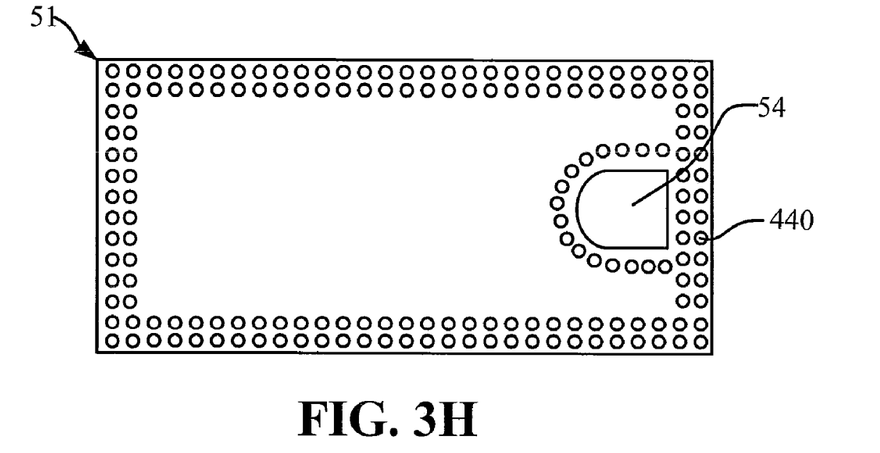
FIG. 3H illustrates a top view of the structure shown in FIG. 3B.

Please refer to FIG. 3G. FIG. 3G illustrates a top view of the structure shown in FIG. 3A, wherein the shadow region in FIG. 3G represents a surrounding portion 510 of the semiconductor stack structure 51. Next, an etching process is performed on the surrounding portion 510 of the semiconductor stack structure 51, so that the primary stack structure 42 and the plurality of pillar-like holes 440 both formed by the semiconductor stack structure 51 are etched, the plurality of pillar-like holes 440 is located on the surrounding portion 510 and surrounds the primary stack structure 42, and the plurality of pillar-like holes 440 protrudes into the surrounding portion 510, as shown in FIG. 3B and FIG. 3H. It should be noticed that the position of the dotted-line can represent the position of the cutting way defined on the substrate 40 shown in FIG. 3G. Comparing FIG. 3G and FIG. 3H, the majority of pillar-like holes 440 can be located on the cutting way approximately. Moreover, as shown in FIG. 3H, after the etching process, the partial region of the top surface of the first conducting-type semiconductor layer 54 is exposed to serve as the electrode placing region.

Figure 3I:
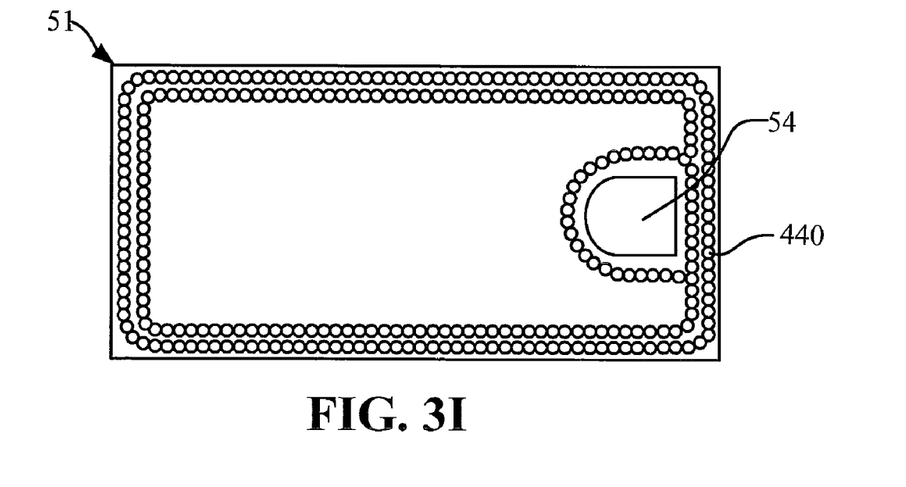
FIG. 3I illustrates a top view of the pillar-like holes arranged as an inner ring-like circle and an outer ring-like circle.

As shown in FIG. 3H, the plurality of pillar-like holes 440 can be dispersedly and crowdedly distributed on the surrounding portion 510. Moreover, in an embodiment, the plurality of pillar-like holes 440 can form at least one ring-like circle to surround the primary stack structure, and each ring-like circle is formed by mutually connecting the plurality of pillar-like holes 440 approximately. As shown in FIG. 3I, the plurality of pillar-like holes 440 can be arranged to form a pattern of an inner ring-like circle and an outer ring-like circle to guarantee that the plurality of pillar-like holes 440 will guide all the light emitted by the light outputting plane to the illuminating layer of the light-emitting diode.

Next, as shown in FIG. 3C, the transparent insulating material 46 is covered with the entire component including the plurality of pillar-like holes 440 shown in FIG. 3B.

Then, as shown in FIG. 3D, the method can use a selective etching method to remove the unnecessary insulating material 46, so that the filled transparent insulating material 46 is about the same height as the plurality of pillar-like holes 440.

Next, as shown in FIG. 3E, the transparent conducting layer 48 is coated on the primary stack structure 42, the transparent insulating material 46, and the top surface of the surrounding portion 510.

As last, as shown in FIG. 3F, the first electrode 50 is formed upon the transparent conducting layer 48, and the second electrode 52 is formed upon the first conducting-type semiconductor layer 54 which is partially exposed.

Please refer to FIG. 4A to FIG. 4F. FIG. 4A to FIG. 4F illustrate cross-sectional views of the manufacturing method of the light-emitting diode according to another embodiment of the invention. The manufacturing method is described as follows.

Figure 4A:
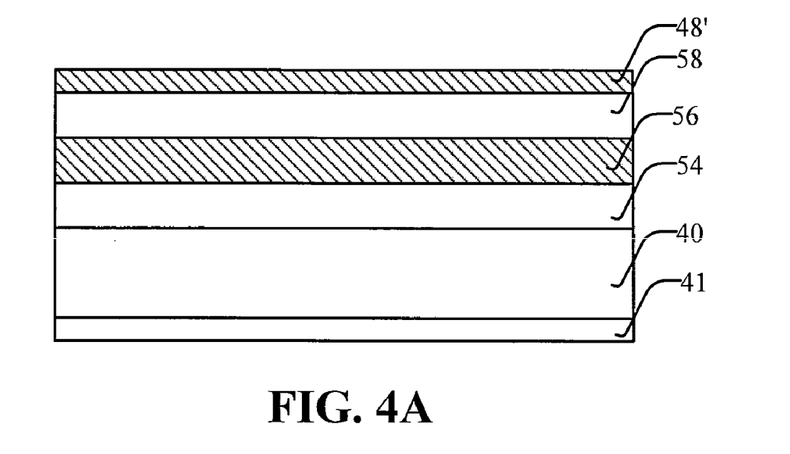
FIG. 4A~FIG. 4F illustrate cross-sectional views of the manufacturing method of the light-emitting diode according to another embodiment of the invention.

As shown in FIG. 4A, firstly, the first conducting-type semiconductor layer 54, the illuminating layer 56, the second conducting-type semiconductor layer 58, and the transparent conducting layer 48' are formed on the substrate 40 to make a semiconductor stack structure. In a preferred embodiment, the method further forms a reflective layer 41 on a bottom surface of the substrate 40 to make the light-emitting diode 4 light upward.

Figure 4B:
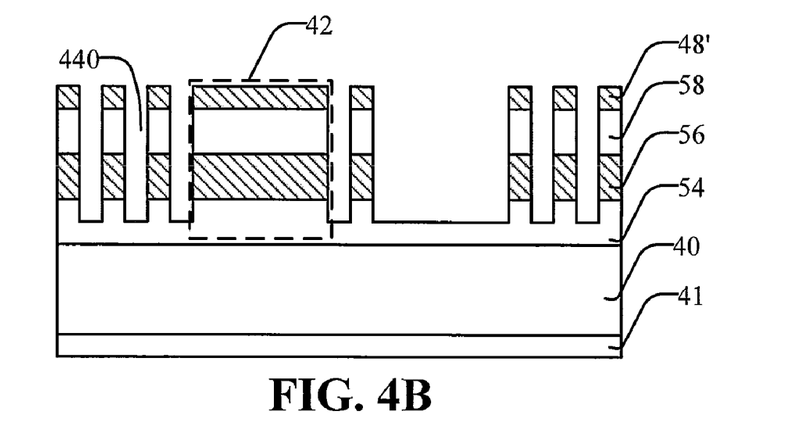

Next, as shown in FIG. 4B, a etching process is performed on the surrounding portion of the semiconductor stack structure, so that the primary stack structure 42 and the plurality of pillar-like holes 440 both formed by the semiconductor stack structure are etched, the plurality of pillar-like holes 440 is located on the surrounding portion and surrounds the primary stack structure 42, and the plurality of pillar-like holes 440 protrudes into the surrounding portion. As to the surrounding portion and the distributive position of the pillar-like hole 440, please refer to FIG. 3G, FIG. 3H, and FIG. 3I again.

Figure 4C:
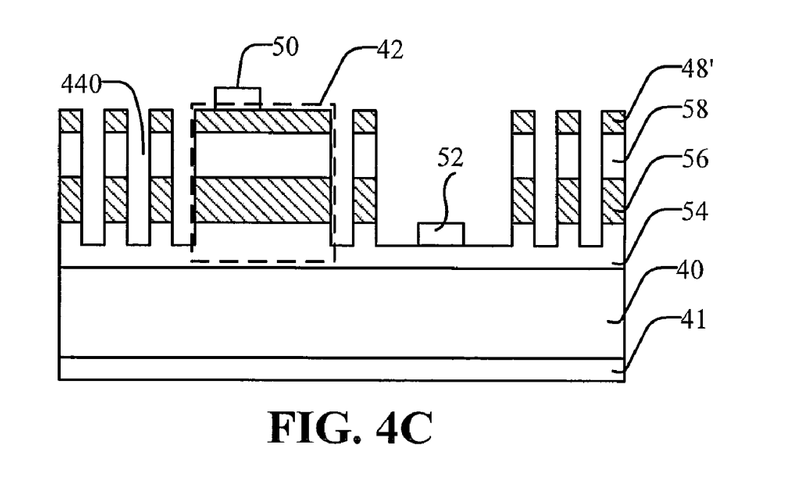

Next, as shown in FIG. 4C, the first electrode 50 and the second electrode 52 are located on the transparent conducting layer 48' and the predetermined exposed first conducting-type semiconductor layer 54.

Figure 4D:
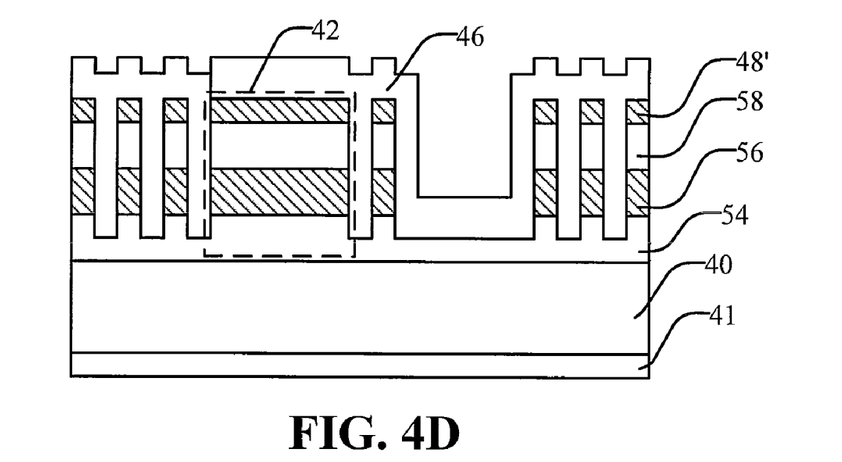

In an embodiment, after the step shown in FIG. 4B, the manufacturing method can further cover the entire component including the plurality of pillar-like holes 440 with the transparent insulating material 46, as shown in FIG. 4D.

Figure 4E:
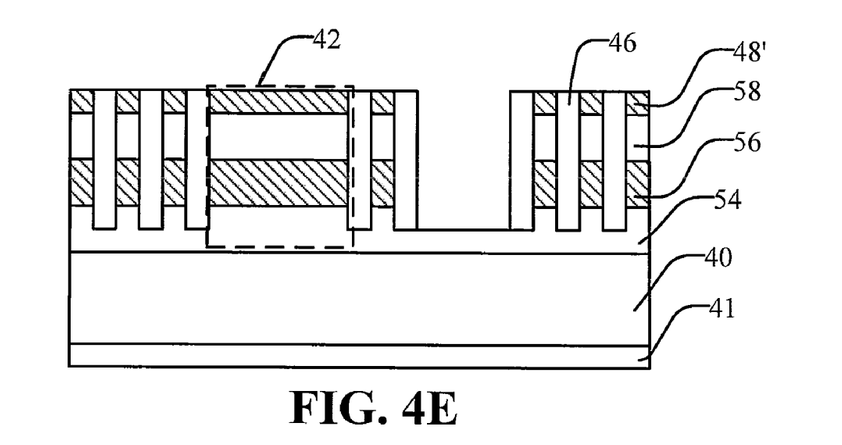

Then, as shown in FIG. 4E, the method can use a selective etching method to remove the unnecessary insulating material 46, so that the filled transparent insulating material 46 is about the same height as the plurality of pillar-like holes 440.

Figure 4F:
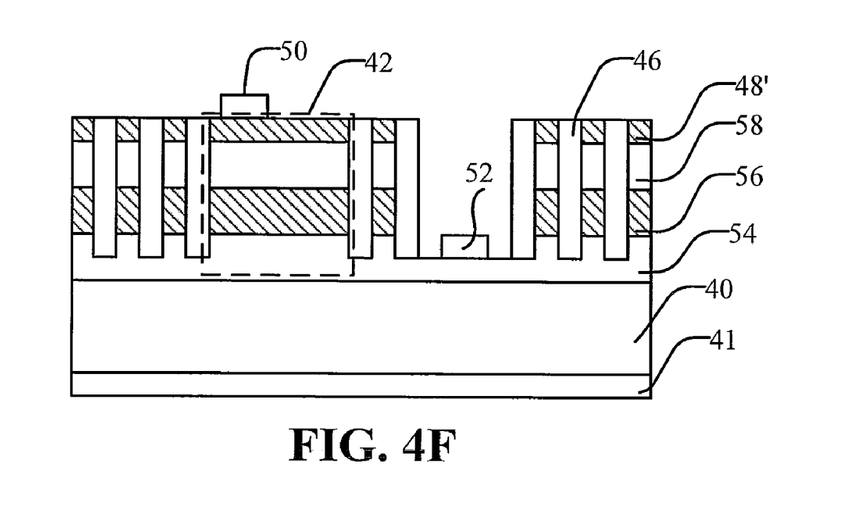

At last, as shown in FIG. 4F, the first electrode 50 is formed upon the transparent conducting layer 48', and the second electrode 52 is formed upon the first conducting-type semiconductor layer 54 which is partially exposed.

Figure 5A:
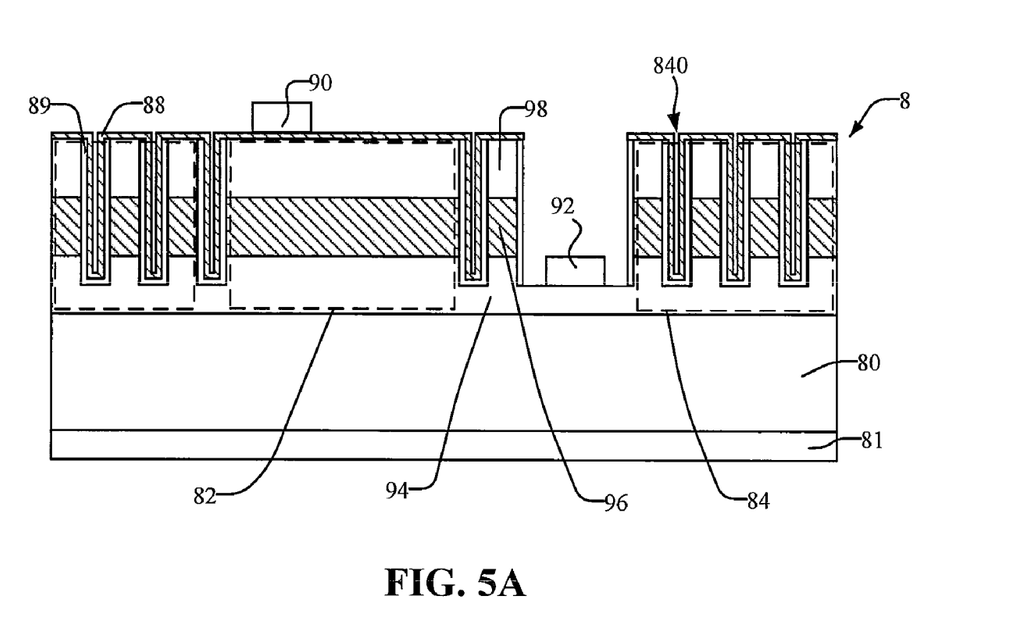
FIG. 5A and FIG. 5B illustrate cross-sectional views of the light-emitting diode according to an embodiment of the invention.

Please refer to FIG. 5A, FIG. 5A illustrates a cross-sectional view of the light-emitting diode 8 in another embodiment of the invention.

The light-emitting diode 8 includes a substrate 80, a primary stack structure 82, a secondary stack structure 84, a transparent insulating material layer 89, a continual transparent conducting layer 88, a first electrode 90, and a second electrode 92. In a preferred embodiment, the light-emitting diode 8 further includes a reflective layer 81 formed on a bottom surface of the substrate 80 to make the light-emitting diode 8 light upward.

It should be noticed that the primary stack structure 82 is formed on the substrate 80. The secondary stack structure 84 is formed on the substrate 80, and the secondary stack structure 84 surrounds the primary stack structure 82. The primary stack structure 82 and the secondary stack structure 84 both have a first conducting-type semiconductor layer 94, an illuminating layer 96, and a second conducting-type semiconductor layer 98 sequentially formed on the substrate 80, wherein a plurality of pillar-like holes 840 is formed in a top surface of the secondary stack structure 84, and the plurality of pillar-like holes 840 protrudes into the secondary stack structure 84. In practical applications, a cutting way is defined upon the substrate 80, and the majority of pillar-like holes 840 are located on the cutting way approximately.

In fact, the first conducting-type semiconductor layer 94, the illuminating layer 96, and the second conducting-type semiconductor layer 98 can be formed by a nitride material. And, in a preferred embodiment, the refractive index of the transparent conducting layer 88 is between the refractive index of the air and the refractive index of the nitride material.

Figure 5B:
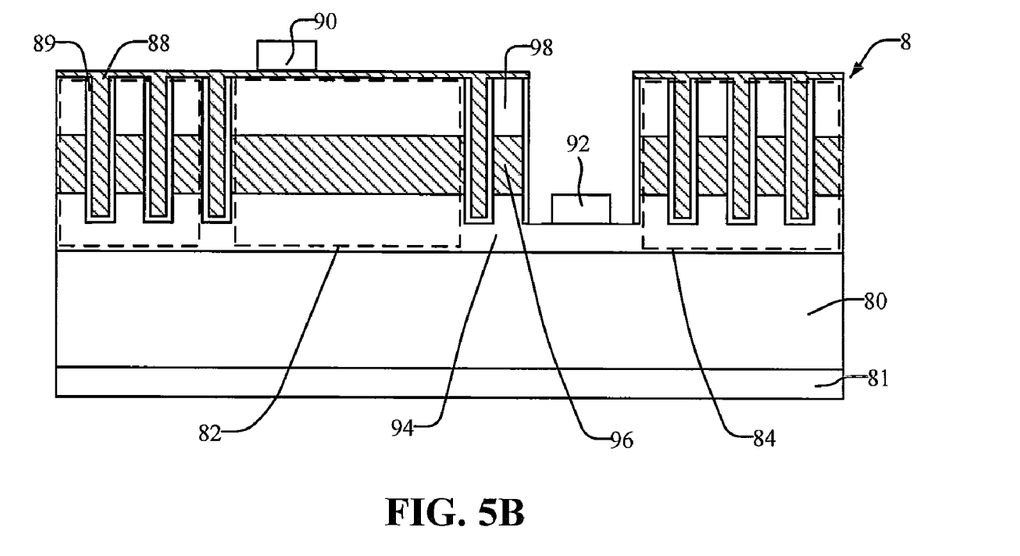

As shown in FIG. 5A, the transparent insulating material layer 89 is coated on a surface of the plurality of pillar-like holes 840, and the continual transparent conducting layer 88 is coated on the transparent insulating material layer 89, the second conducting-type semiconductor layer of the primary stack structure 82 and a surface of the second conducting-type semiconductor layer of the secondary stack structure 84. It should be noticed that the transparent conducting layer 88 can further be filled into the plurality of pillar-like holes 840, as shown in FIG. 5B. The first electrode 90 is formed upon the transparent conducting layer 88, and the second electrode 92 is formed upon the partial exposed first conducting-type semiconductor layer 94.

It should be noticed that the surface outline of the plurality of pillar-like holes 840 can be designed to further increase the illuminating output efficiency. In a preferred embodiment, the plurality of pillar-like holes 840 has a rough sidewall and a rough bottom (please refer to FIG. 2C again). In another preferred embodiment, the plurality of pillar-like holes 840 has a counter-trapezoid cross-section (please refer to FIG. 2D again).

Moreover, in another embodiment, the first electrode 90 of the light-emitting diode 8 is formed upon the transparent conducting layer 88, and the second electrode 92 can be formed upon a lower surface of the substrate 80. It should be noticed that the substrate is formed by the conducting material in this embodiment. The light-emitting diode of this embodiment has the advantage that the illuminating layer does not need to be partially etched to form a partial region exposed for placing an electrode on the top surface of the first conducting-type semiconductor layer, so the light-emitting diode in this embodiment has larger illuminating area.

Please refer to FIG. 6A to FIG. 6E. FIG. 6A to FIG. 6E illustrate a series of cross-sectional views of the manufacturing light-emitting diode 9 in FIG. 5A in an embodiment of the invention. The manufacturing method is described as follows.

As shown in FIG. 6. Firstly, the manufacturing method continuously forms the first conducting-type semiconductor layer 94, the illuminating layer 96, and the second conducting-type semiconductor layer 98 on the substrate 90 to make a semiconductor stack structure. In a preferred embodiment, the method further forms a reflective layer 81 on a bottom surface of the substrate 80 to make the light-emitting diode 8 light upward.

Figure 6A:
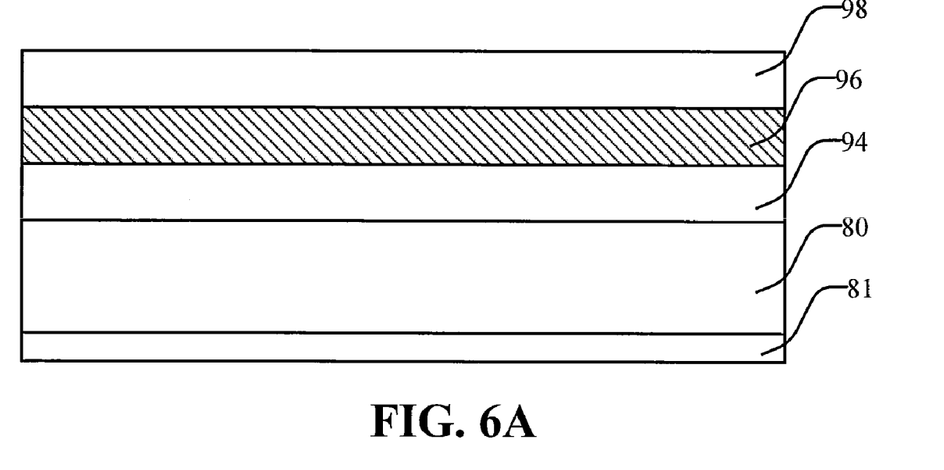
FIG. 6A~FIG. 6E illustrate a series of cross-sectional views of the manufacturing light-emitting diode shown in FIG. 5A according to an embodiment of the invention.
Figure 6B:
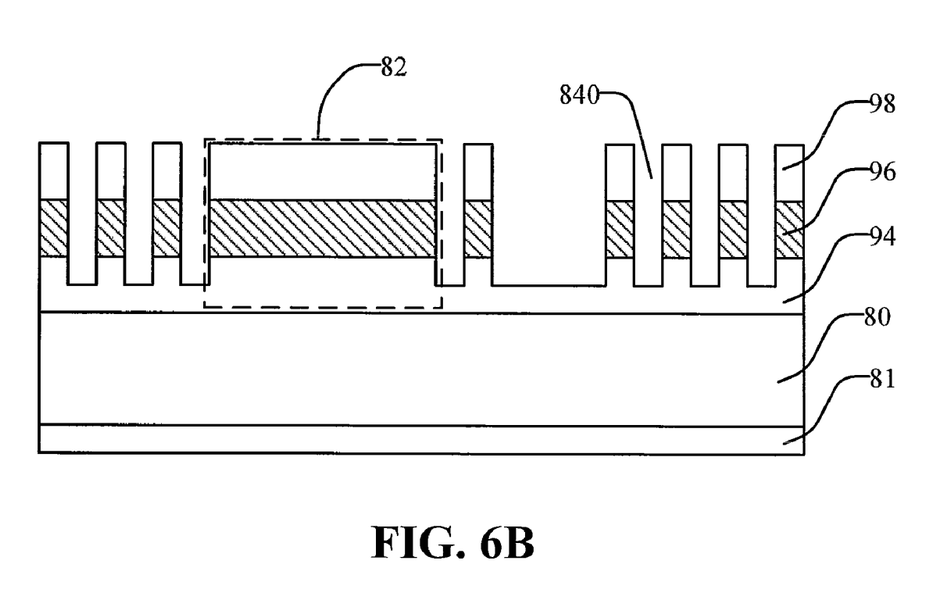

Next, as shown in FIG. 6B, a etching process is performed on the surrounding portion of the semiconductor stack structure, so that the primary stack structure 82 and the plurality of pillar-like holes 840 both formed by the semiconductor stack structure are etched, the plurality of pillar-like holes 840 is located on the surrounding portion and surrounds the primary stack structure 42, and the plurality of pillar-like holes 840 protrudes into the surrounding portion. As to the surrounding portion and the distributive position of the pillar-like hole 840, please refer to FIG. 3G, FIG. 3H, and FIG. 3I again.

Figure 6C:
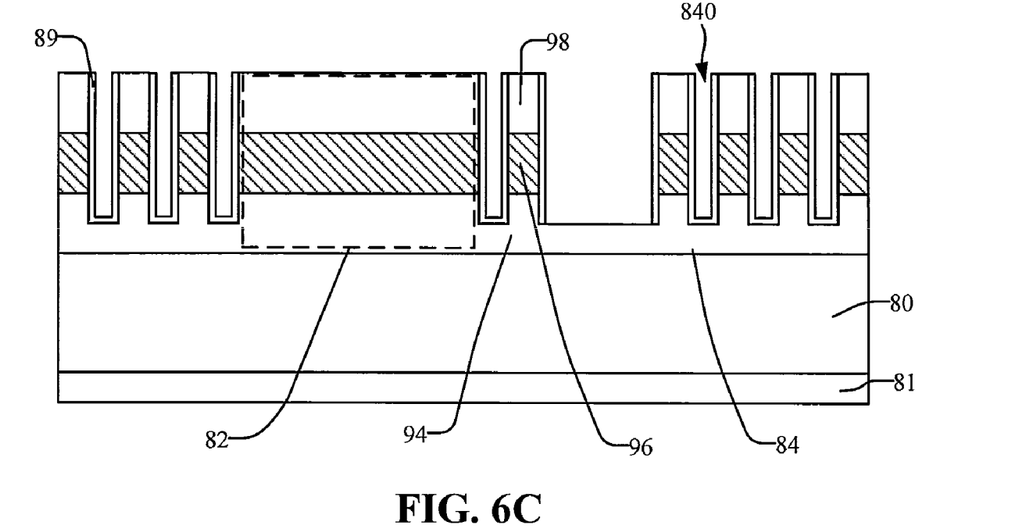
Figure 6D:
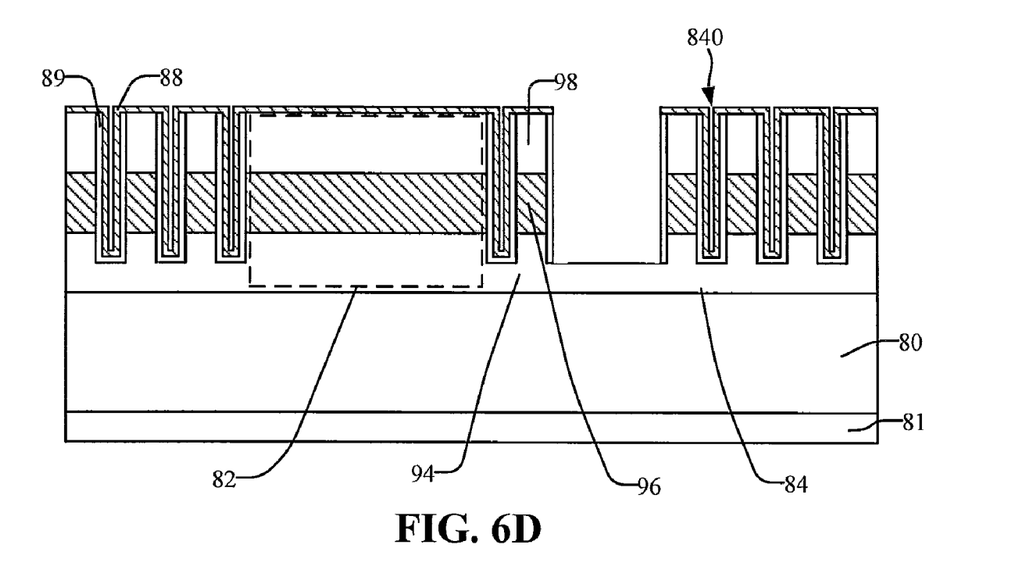

Then, as shown in FIG. 6C, the transparent insulating material layer 89 is coated on a surface of the plurality of pillar-like holes 840. As shown in FIG. 6D, the continual transparent conducting layer 88 is coated on the transparent insulating material layer 89, the second conducting-type semiconductor layer of the primary stack structure 82, and a top surface of the surrounding portion. It should be noticed that the transparent conducting layer 88 can further be filled into the plurality of pillar-like holes 840, as shown in FIG. 5B.

Figure 6E:
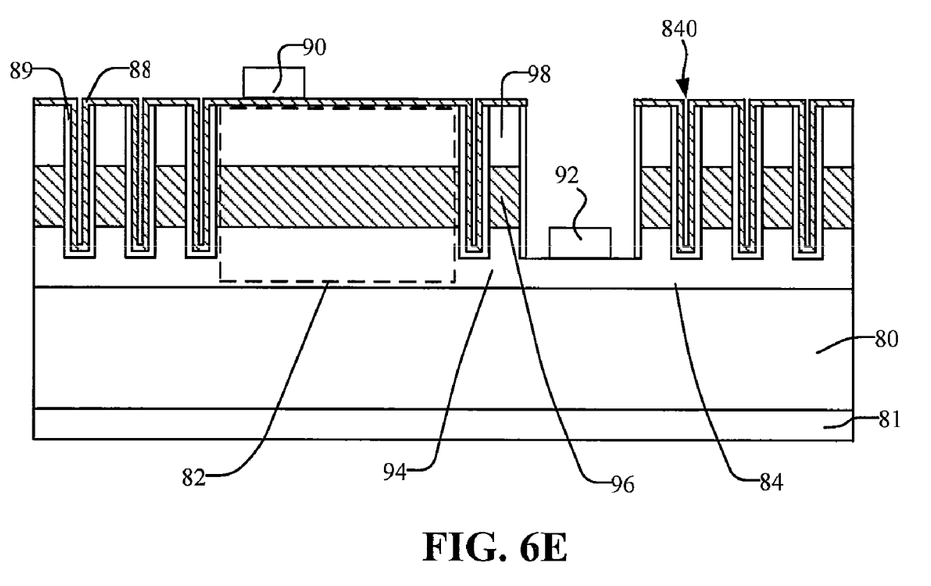

At last, as shown in FIG. 6E, the first electrode 90 is formed upon the transparent conducting layer 88, and the second electrode 92 is formed upon the partial exposed first conducting-type semiconductor layer 94.

Compared to prior arts, the light-emitting diode of the invention includes the plurality of pillar-like holes as mentioned above; therefore, the light-extraction efficiency of the light-emitting diode can be increased. Furthermore, filling the transparent insulating material having the high refractive index into the plurality of pillar-like holes can not only lower the total reflection of the ray inner in the light-emitting diode, but also increase the anti-breakdown strength of the component. Additionally, coating the transparent conducting layer upon the top surface of the secondary stack structure can make the driving current of the light-emitting diode to flow to the part without pillar-like holes in the secondary stack structure and further make that part of the partial illuminating layer light, so that that part of illuminating area will not be lost.

Although the present invention has been illustrated and described with reference to the preferred embodiment thereof, it should be understood that it is in no way limited to the details of such embodiment but is capable of numerous modifications within the scope of the appended claims.

What is claimed is:

1. An light-emitting diode, comprising:
    a substrate;
    a primary stack structure being formed on the substrate;
    a secondary stack structure being formed on the substrate and surrounding the primary stack structure, the primary stack structure and the secondary stack structure both having a first conducting-type semiconductor layer, an illuminating layer, and a second conducting-type semiconductor layer sequentially formed on the substrate, wherein a plurality of pillar-like holes is formed in a top surface of the second conducting-type semiconductor layer of the secondary stack structure and the plurality of pillar-like holes protrudes into the first conducting-type semiconductor layer of the secondary stack structure;
    a transparent insulating material being filled into the plurality of pillar-like holes; and
    a transparent conducting layer being coated on the second conducting-type semiconductor layer of the primary stack structure, the transparent insulating material, and a surface of the second conducting-type semiconductor layer of the secondary stack structure.

2. The light-emitting diode of claim 1, wherein a cutting way is defined upon the substrate, and the plurality of pillar-like holes are located on the cutting way approximately.

3. The light-emitting diode of claim 1, wherein the refractive index of the transparent insulating material is between the refractive index of the air and the refractive index of the nitride material.

4. The light-emitting diode of claim 1, wherein the plurality of pillar-like holes has a rough surface.

5. The light-emitting diode of claim 1, wherein the plurality of pillar-like holes has a counter-trapezoid cross-section.

6. The light-emitting diode of claim 1, wherein the plurality of pillar-like holes forms at least one ring-like circle to surround the primary stack structure, and each ring-like circle is formed by mutually connecting the plurality of pillar-like holes approximately.

7. The light-emitting diode of claim 1, wherein the transparent insulating material is filled into the plurality of pillar-like holes, so that the filled transparent insulating material is about the same height as the plurality of pillar-like holes.

8. An light-emitting diode, comprising:
    a substrate;
    a primary stack structure being formed on the substrate; and
    a secondary stack structure being formed on the substrate and surrounding the primary stack structure, the primary stack structure and the secondary stack structure both having a first conducting-type semiconductor layer, an illuminating layer, a second conducting-type semiconductor layer and a transparent conducting layer sequentially formed on the substrate, wherein a plurality of pillar-like holes is formed in a top surface of the transparent conducting layer of the secondary stack structure and the plurality of pillar-like holes protrudes into the first conducting-type semiconductor layer of the secondary stack structure.

9. The light-emitting diode of claim 8, further comprising a transparent insulating material, wherein the transparent insulating material is filled into the plurality of pillar-like holes.

10. The light-emitting diode of claim 9, wherein the transparent insulating material is filled into the plurality of pillar-like holes, so that the filled transparent insulating material is about the same height as the plurality of pillar-like holes.

11. The light-emitting diode of claim 8, wherein a cutting way is defined upon the substrate, and the plurality of pillar-like holes are located on the cutting way approximately.

12. The light-emitting diode of claim 8, wherein the refractive index of the transparent insulating material is between the refractive index of the air and the refractive index of the nitride material.

13. The light-emitting diode of claim 8, wherein the plurality of pillar-like holes has a rough surface.

14. The light-emitting diode of claim 8, wherein the plurality of pillar-like holes has a counter-trapezoid cross-section.

15. The light-emitting diode of claim 8, wherein the plurality of pillar-like holes forms at least one ring-like circle to surround the primary stack structure, and each ring-like circle is formed by mutually connecting the plurality of pillar-like holes approximately.

16. An light-emitting diode, comprising:

a substrate;

a primary stack structure being formed on the substrate;

a secondary stack structure being formed on the substrate and surrounding the primary stack structure, the primary stack structure and the secondary stack structure both having a first conducting-type semiconductor layer, an illuminating layer, and a second conducting-type semiconductor layer sequentially formed on the substrate, wherein a plurality of pillar-like holes is formed in a top surface of the second conducting-type semiconductor layer of the secondary stack structure and the plurality of pillar-like holes protrudes into the first conducting-type semiconductor layer of the secondary stack structure;

a transparent insulating material layer being coated on a surface of the plurality of pillar-like holes; and a continual transparent conducting layer being coated on the transparent insulating material layer, the second conducting-type semiconductor layer of the primary stack structure and a surface of the second conducting-type semiconductor layer of the secondary stack structure.

17. The light-emitting diode of claim 16, wherein a cutting way is defined upon the substrate, and the plurality of pillar-like holes are located on the cutting way approximately.

18. The light-emitting diode of claim 16, wherein the refractive index of the transparent conducting layer is between the refractive index of the air and the refractive index of the nitride material.

19. The light-emitting diode of claim 16, wherein the transparent conducting layer is further filled into the plurality of pillar-like holes.

20. The light-emitting diode of claim 16, wherein the plurality of pillar-like holes has a rough surface.

21. The light-emitting diode of claim 16, wherein the plurality of pillar-like holes has a counter-trapezoid cross-section.

22. The light-emitting diode of claim 16, wherein the plurality of pillar-like holes forms at least one ring-like circle to surround the primary stack structure, and each ring-like circle is formed by mutually connecting the plurality of pillar-like holes approximately.

* * * * *